US012677379B2

(12) United States Patent
Hansen

(10) Patent No.: US 12,677,379 B2
(45) Date of Patent: Jul. 7, 2026

(54) LATCHING SYSTEM FOR ESTABLISHING A LATCHING CONNECTION BETWEEN A PRINTED CIRCUIT BOARD AND AN EDGE-CONTACT PLUG, PRINTED CIRCUIT BOARD, EDGE- CONTACT PLUG AND ADD-ON PART

(71) Applicant: HELLA GmbH & Co. KGaA, Lippstadt (DE)

(72) Inventor: Alexander Hansen, Paderborn (DE)

(73) Assignee: Hella GmbH & Co. KGaA, Lippstadt (DE)

( * ) Notice: Subject to any disclaimer, the term of this patent is extended or adjusted under 35 U.S.C. 154(b) by 279 days.

(21) Appl. No.: 18/384,597

(22) Filed: Oct. 27, 2023

(65) Prior Publication Data

US 2024/0064909 A1     Feb. 22, 2024

Related U.S. Application Data

(63) Continuation of application No. PCT/EP2022/060067, filed on Apr. 14, 2022.

(30) Foreign Application Priority Data

Apr. 29, 2021     (DE) ..................... 10 2021 111 047.5

(51) Int. Cl.
*H05K 3/325*          (2026.01)
*H01R 12/72*          (2011.01)
(Continued)

(52) U.S. Cl.
CPC ........... *H05K 3/326* (2013.01); *H01R 12/721* (2013.01); *H01R 13/6273* (2013.01); *H05K 1/117* (2013.01); *H05K 2201/09163* (2013.01)

(58) Field of Classification Search
CPC ................... H05K 3/326; H05K 1/117; H05K 2201/09163; H01R 12/721; H01R 13/6273
(Continued)

(56) References Cited

U.S. PATENT DOCUMENTS 4,521,065 A     6/1985     Nestor et al.
6,123,575 A     9/2000     Huang et al.
(Continued)

FOREIGN PATENT DOCUMENTS

DE     102018132405 A1     6/2020
EP          3455909 B1     11/2020
(Continued)

OTHER PUBLICATIONS

International Search Report dated Jul. 22, 2022 in corresponding application PCT/EP2022/060067.

*Primary Examiner* — Gary F Paumen
(74) *Attorney, Agent, or Firm* — Muncy, Geissler, Olds & Lowe, P.C.

(57)          ABSTRACT

The present invention relates to a latching system, including a printed circuit board and an edge-contact plug, for establishing a latching connection between the printed circuit board and the edge-contact plug, including two retaining arms, each having a latch, the edge-contact plug including two mating latches for establishing the latching connection with the latch. The mating latches being formed on two different outer sides of the edge-contact plug as a set-back portion on the outer sides in each case, and the latches being able to engage with the set-back portions on the outer sides to establish the latching connection.

10 Claims, 5 Drawing Sheets

(51) Int. Cl.
  *H01R 13/627*     (2006.01)
  *H05K 1/11*      (2006.01)

(58) Field of Classification Search
  USPC ........................................................... 439/59
  See application file for complete search history.

(56)             References Cited

U.S. PATENT DOCUMENTS

| | | | |
|---|---|---|---|
| 9,991,631 | B2 | 6/2018 | Zhao et al. |
| 10,601,156 | B2 | 3/2020 | Lappoehn |
| 10,811,795 | B2 | 10/2020 | Roldan et al. |
| 2013/0109240 | A1 | 5/2013 | Chiang |
| 2018/0040977 | A1* | 2/2018 | Zhao .................... H01R 13/428 |
| 2019/0296466 | A1* | 9/2019 | Lappoehn ............ H01R 13/629 |
| 2020/0403355 | A1* | 12/2020 | Zhu .................... H01R 13/6275 |

FOREIGN PATENT DOCUMENTS

| | | | |
|---|---|---|---|
| FR | 2975538 | A3 | 11/2012 |
| JP | 2020155390 | A | 9/2020 |

* cited by examiner

1

LATCHING SYSTEM FOR ESTABLISHING A LATCHING CONNECTION BETWEEN A PRINTED CIRCUIT BOARD AND AN EDGE-CONTACT PLUG, PRINTED CIRCUIT BOARD, EDGE- CONTACT PLUG AND ADD-ON PART

This nonprovisional application is a continuation of International Application No. PCT/EP2022/060067, which was filed on Apr. 14, 2022, and which claims priority to German Patent Application No. 10 2021 111 047.5, which was filed in Germany on Apr. 29, 2021, and which are both herein incorporated by reference.

BACKGROUND OF THE INVENTION

Field of the Invention

The present invention relates to a latching system, including a printed circuit board and an edge-contact plug for establishing a latching connection between the printed circuit board and the edge-contact plug, including two retaining arms, each having a latch, the edge-contact plug including two mating latches for establishing the latching connection with the aid of the latches. The invention further relates to an edge-contact plug and a printed circuit board for a latching system of this type as well as an add-on part for a printed circuit board.

Description of the Background Art

So-called edge-contact plugs for the edge-side connection to terminals of printed circuit boards are known in the prior art. Since edge-contact plugs generally have a relatively low self-retaining force on the terminal, additional retaining systems were developed to hold the edge-contact plug on the terminal or on the printed circuit board in a stable manner. For this purpose, a latching system including a printed circuit board and an edge-contact plug is described in U.S. Pat. No. 10,811,795, which is incorporated herein by reference. Two retaining arms, each including a latch, are formed on the printed circuit board. The edge-contact plug is designed in such a way that the retaining arms or the latches engage on a back side of the edge-contact plug once the latter is connected to the terminal in the predefined manner. Certain edge-contact plugs may thus be easily plugged into predefined retaining sites on the printed circuit board, where they are securely held in the desired position. If the geometry of the edge-contact plug deviates from the standard, in particular in terms of its length, this may result in problems in the use of the retaining device. A standardization of the locking system is hardly possible, due to a large number of different concepts.

SUMMARY OF THE INVENTION

It is therefore an object of the present invention to at least partially take into account the problems described above. In particular, the object of the present invention is to provide a system for the easy, flexible, and nevertheless stable fastening of an edge-contact plug to a printed circuit board.

The above object is achieved by an exemplary latching system, a edge-contact plug, a printed circuit board, and an add-on part. Features which are described in connection with the latching system also apply, of course, in connection with the edge-contact plug according to the invention, the printed circuit board according to the invention, the add-on part according to the invention, and vice versa in each case, so that reference always is and/or may be made interchangeably with respect to the disclosure of the individual aspects of the invention.

According to a first aspect of the present invention, a latching system, including a printed circuit board and an edge-contact plug, is proposed for establishing a latching connection between the printed circuit board and the edge-contact plug. The latching system includes two retaining arms, each having a latch, the edge-contact plug including two mating latches for establishing the latching connection with the latch, the mating latches each being formed on two different outer sides of the edge-contact plug in the form of a set-back portion on the outer sides, and the latch being able to engage with the set-back portions on the outer sides in each case.

An easy, flexibly insertable, and nevertheless stable approach with the aid of the set-back portions for holding the edge-contact plugs on the printed circuit board is provided by a latch for engagement on the two outer sides of the edge-contact plug. Due to the latching contact on the outer side and/or the side surface of the edge-contact plug, an approach capable of being standardized is even possible for holding edge-contact plugs on printed circuit boards, since it is, in principle, immaterial what absolute length the edge-contact plug has. The latching geometry may also be reusable and may also be used for other numbers of poles. The outer side can be understood to be, in particular, an outermost side of the edge-contact plug. The outer side may preferably be understood to be an outer side which faces away from the edge-contact plug. The set-back portion can extend exclusively along the outer side or the particular outer side section. In addition, the outer side can have a closed surface structure in the region of the set-back portion.

The printed circuit board may be understood to be a card, a PC board, and/or a printed circuit. The printed circuit board can be configured as a carrier for electronic components and can be used to mechanically fasten and electrically connect these components. The latching connection may be understood to be a form-fitting and/or force-fitting connection, which is implemented by spreading the retaining arms with the aid of the edge-contact plug and subsequently compressing the retaining arms. At least one retaining arm can be provided with a spring-elastic design. Both retaining arms are particularly preferably provided with a spring-elastic design.

The latches each can have a wedge-shaped latching tab in a latching system. On the one hand, a sufficiently great retaining force is implemented thereby for holding the edge-contact plug on the printed circuit board. On the other hand, a detachment of the edge-contact plug from the printed circuit board is easily made possible thereby without an additional tool.

Moreover, the set-back portions may each be provided with a notch-shaped design in a latching system according to the invention. A sufficiently great retaining force is also implemented thereby for holding the edge-contact plug on the printed circuit board, while it is still possible to easily detach the edge-contact plug from the printed circuit board without an additional tool. Due to a predefined notch geometry and/or one dependent on the edge-contact plug, a pushing of the edge-contact plug into the terminal with the aid of an excessively high force may also be prevented. The notch and/or a correspondingly designed set-back portion may at least reduce and/or counteract the insertion force starting at a certain point. An unintentional destruction of the terminal may be prevented thereby.

It is furthermore possible that the set-back portions are each provided with a stepped design in a latching system according to the invention. The set-back portions can be provided with a particularly simple design, and the edge-contact plug may be correspondingly easily as well as cost-effectively manufactured. Each set-back portion preferably has exactly one step. The step may be designed at a right angle or preferably in a ramp-shaped manner in the region of the set-back portion.

In a latching system according to the invention, it may also be advantageous if the edge-contact plug has an upper side, a lower side, a contact side, a back side, and the two outer sides, the set-back portions each extending up to the upper side and/or to the lower side. This means that the set-back portions may extend up to the upper and/or lower outer side of the edge-contact plug in a height and/or thickness direction of the edge-contact plug. An easy latching contact with the latches may be established thereby.

In a latching system according to the present invention, the set-back portions may also extend continuously over the entire height of the edge-contact plug from the upper side to the lower side. This permits a particularly easy and reliable engagement of the latch with the set-back portions.

In a latching system according to the invention, the retaining arms may extend beyond an edge contour of the printed circuit board in the manner of a projection. This makes it possible to prevent the edge-contact plug from unnecessarily occupying too much space on the printed circuit board or the printed circuit board from being completely fitted with components without any material cutouts.

It is moreover possible that the retaining arms in a latching system according to the invention are designed as a single-piece and/or monolithic component of the printed circuit board. The latching system or the printed circuit board may be provided in a particularly space-saving manner thereby. The necessary installation space is limited to the basic necessity. In addition, no additional parts or additional geometries on adjacent parts are necessary. The mating latches may also be designed with corresponding advantages as a single-piece and/or monolithic component of the edge-contact plug or a base and/or housing body of the edge-contact plug.

In addition, it is possible for a latching system according to the invention to include an add-on part having a fastener for fastening the add-on part to the printed circuit board, the add-on part including the two retaining arms for establishing the latching connection with the edge-contact plug. The desired effect may thus be easily achieved on printed circuit boards which do not yet have a suitable latch. The add-on part may be connected to a printed circuit board, in particular in a materially bonded manner, via the fastener, which may be understood as a simple fastening surface. Once the add-on part is fastened to the printed circuit board, the add-on part may be understood as being an integral part of the printed circuit board. This means that the latching connection between the printed circuit board and the edge-contact plug may also be understood as a latching connection between the add-on part and the edge-contact plug.

In a latching system according to the present invention, the edge-contact plug may have an upper side, a lower side, a contact side, a back side, and the two outer sides, the width of the edge-contact plug between the two outer sides being consistently smaller in a region between the set-back portion and the back side than in a region between the set-back portion and the contact side. In other words, the edge-contact plug may taper toward the rear in a direction from the contact side to the back side. A simple geometry for the edge-contact plug is provided thereby, which may be correspondingly manufactured without problems and permits an easy latching connection. The tapering or reduction in size of the width in the rear region of the edge-contact plug may extend in a straight or oblique manner. The outer sides in the region between the set-back portion and the back side may extend at an angle or in parallel to each other.

According to a further aspect of the present invention, an edge-contact plug is provided for a latching system as described in detail above. The edge-contact plug can be configured to establish a latching connection with the printed circuit board and includes two mating latches for establishing the latching connection with the latch, the mating latches being formed on two different outer sides of the edge-contact plug as a set-back portion of the outer sides in each case. The edge-contact plug according to the invention thus involves the same advantages as those described in detail with reference to the latching system according to the invention.

A printed circuit board is furthermore described for a latching system as described above for establishing a latching connection to the edge-contact plug. The printed circuit board includes two retaining arms, in particular spring-elastic retaining arms, each having a latch, the latch being able to engage with the set-back portions on the outer sides of the edge-contact plug for establishing the latching connection. The printed circuit board according to the invention therefore also involves the advantages described above.

A further aspect of the invention relates to an add-on part for a latching system as described above, which includes a fastener for fastening the add-on part to a printed circuit board, and two retaining arms, in particular two spring-elastic retaining arms, each including a latch for establishing a latching connection in set-back portions on outer sides of an edge-contact plug as described above. The add-on part according to the invention thus also comprises the advantages described above. The add-on part and the printed circuit board may have different materials. For example, the printed circuit board may be made from metal and the add-on part from plastic, in particular from a printed circuit board material such as a fiber-reinforced plastic. A fastener may be understood to be, for example, a fastening surface, which is designed for the predefined fastening of the add-on part to the printed circuit board, in particular the material bonded fastening by soldering.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
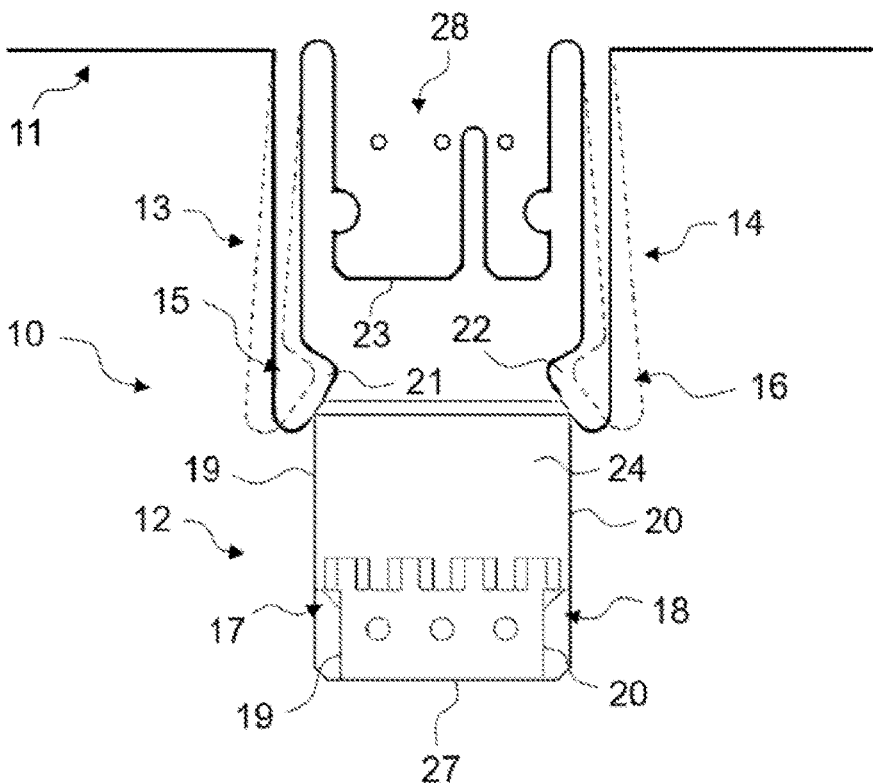
FIG. 1 schematically shows a latching system according to an example of the present invention in a first latched state.

FIG. 1 shows a latching system 10, including a printed circuit board 11 and an edge-contact plug 12, for establishing a latching connection between printed circuit board 11 and edge-contact plug 12. Latching system 10 illustrated in FIG. 1 is shown in a first latching state, in which edge-contact plug 12 is not yet connected to terminal 28 of printed circuit board 11. Printed circuit board 11 includes two spring-elastic retaining arms 13, 14, each having a latch 15, 16. Edge-contact plug 12 includes two mating latches 17, 18 for establishing the latching connection with latch 15, 16. Mating latches 17, 18 are each formed on two different outer sides 19, 20 of edge-contact plug 12 in the form of a set-back portion on the two outer sides 19, 20. Latches 15, 16 are able to engage with the set-back portions on outer sides 19, 20 for establishing the latching connection.

As illustrated in FIG. 1, latches 15, 16 each have a wedge-shaped latching tab 21, 22. The set-back portions are each provided with a stepped design. More specifically, each set-back portion has a step, in which the incline is formed by an oblique plane. Retaining arms 13, 14 extend over an edge contour 23 of printed circuit board 11 in the manner of a projection. Retaining arms 13, 14 are further designed as a monolithic component of printed circuit board 11 or as a monolithic component of the printed circuit board. Mating latch 17 is also designed as a monolithic component of edge-contact plug 12. The material of retaining arms 13, 14 differs from the material of edge-contact plug 12.

Figure 2:
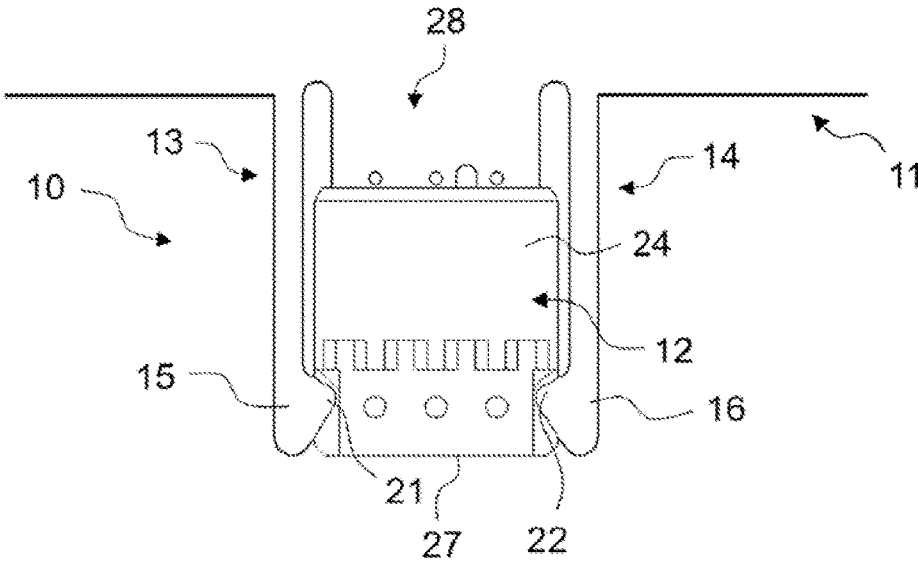
FIG. 2 schematically shows the latching system in a second latching state.

The latching system is illustrated in FIG. 2 in a second latching state, in which edge-contact plug 12 is connected to terminal 28, and latches 15, 16 is subsequently in latching connection with mating latches 17, 18.

Figure 3:
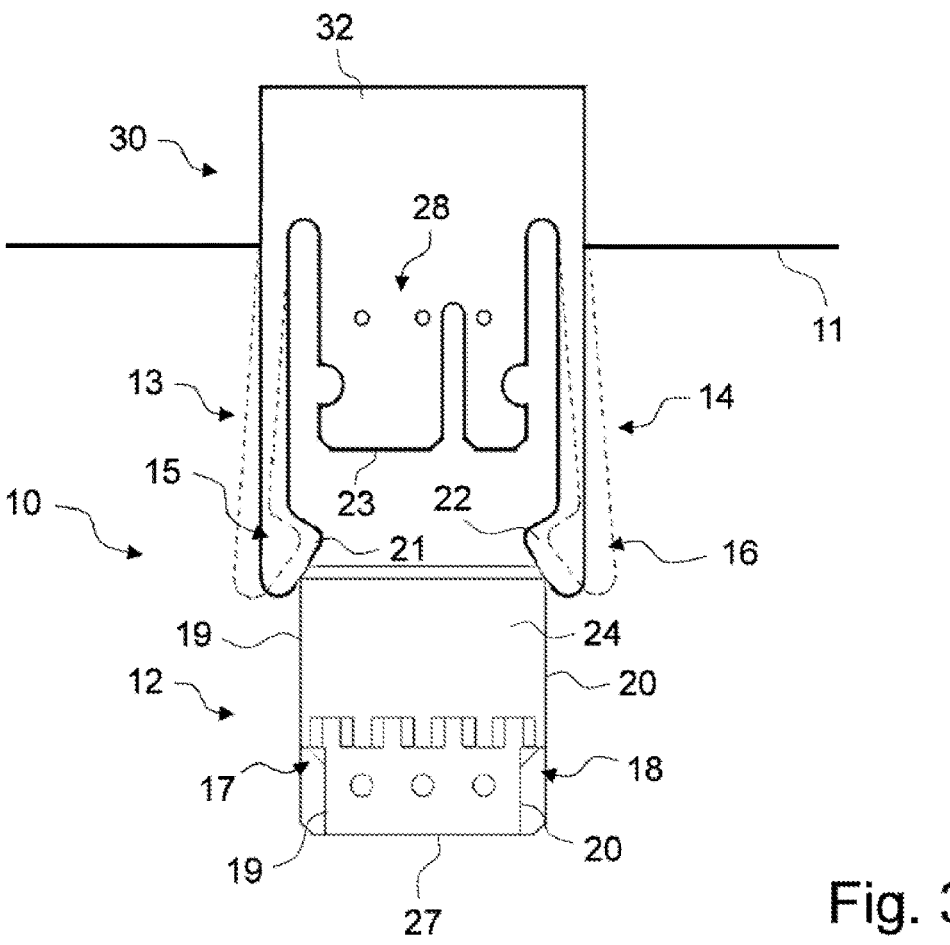
FIG. 3 schematically shows a latching system according to an example of the present invention in a first latching state.
Figure 4:
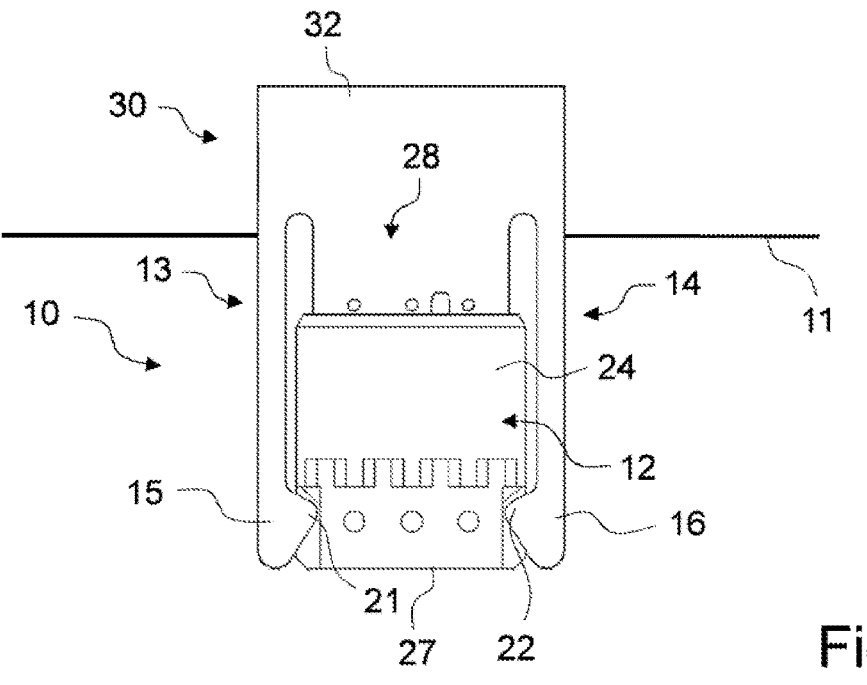
FIG. 4 schematically shows the latching system according to the above example in a second latching state.

FIG. 3 and FIG. 4 show a latching system 10. According to this example, an add-on part 30 has a fastener 32, e.g. a fastening surface, that is fastened to printed circuit board 11. More specifically, add-on part 30 is connected to printed circuit board 11 in a materially bonded manner. Add-on part 30 includes retaining arms 13, 14 for establishing the desired latching connection.

Figure 5:
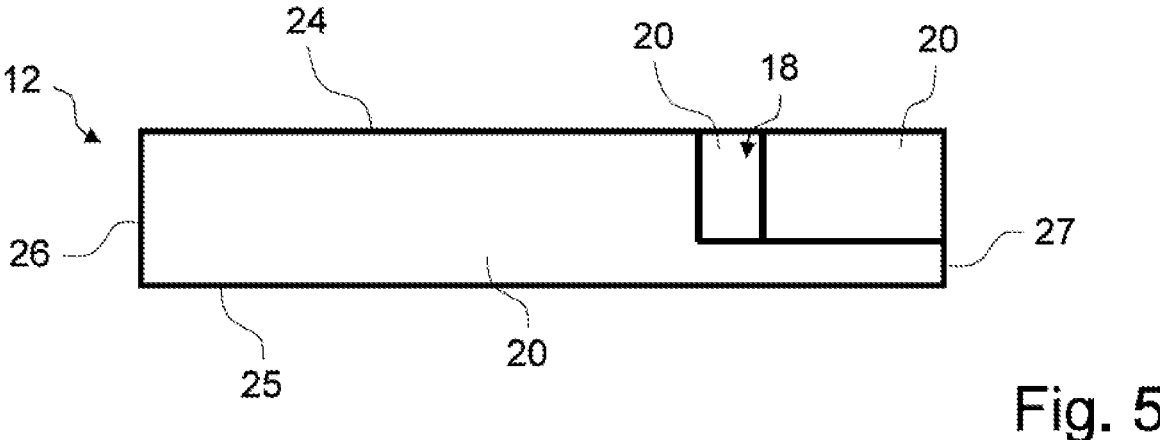
FIG. 5 schematically shows a side view of an edge-contact plug according an example of the present invention.
Figure 6:
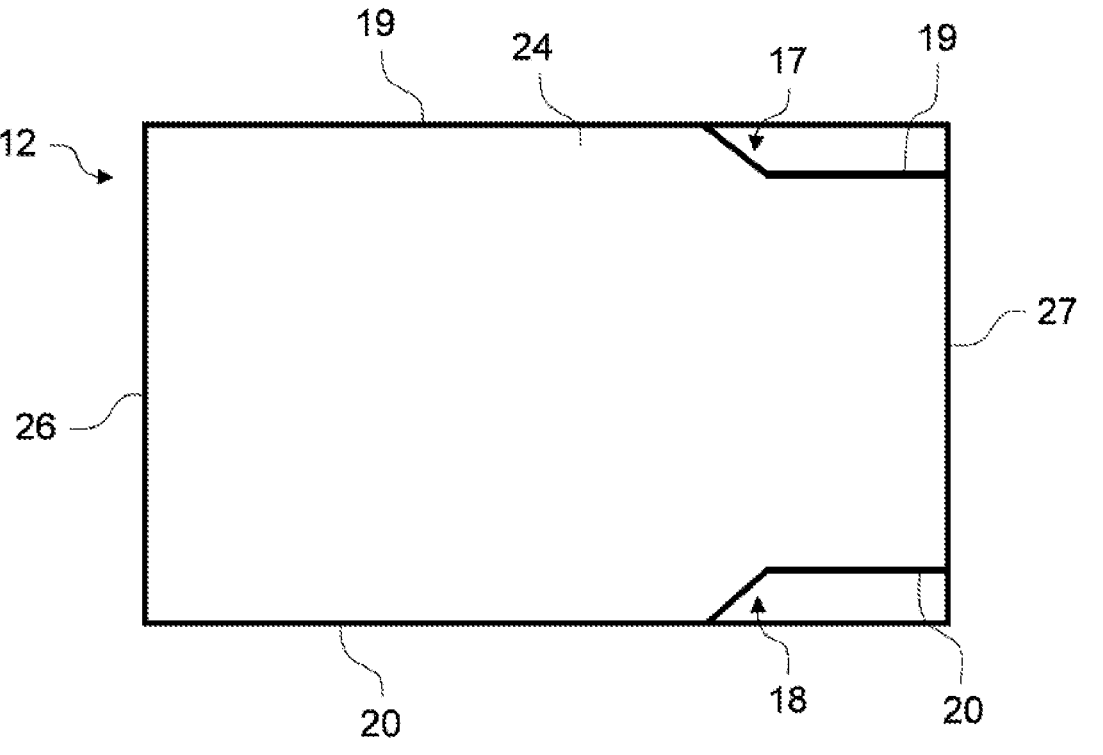
FIG. 6 schematically shows a top view of the edge-contact plug according to the example of the present invention.

An edge-contact plug 12 is illustrated in FIG. 5 and FIG. 6 in a side view and in a top view. As illustrated in FIG. 5, edge-contact plug 12 has an upper side 24, a lower side 25, a contact side 26, a back side 27, and the two outer sides 19, 20, the set-back portions each extending up to upper side 24, as shown in FIG. 6. The width of edge-contact plug 12 between the two outer sides 19, 20 is consistently smaller in a region between the set-back portion and back side 27 than in a region between the set-back portion and contact side 26, the two outer sides 19, 20 running in parallel to each other from the set-back portion to back side 27.

Figure 7:
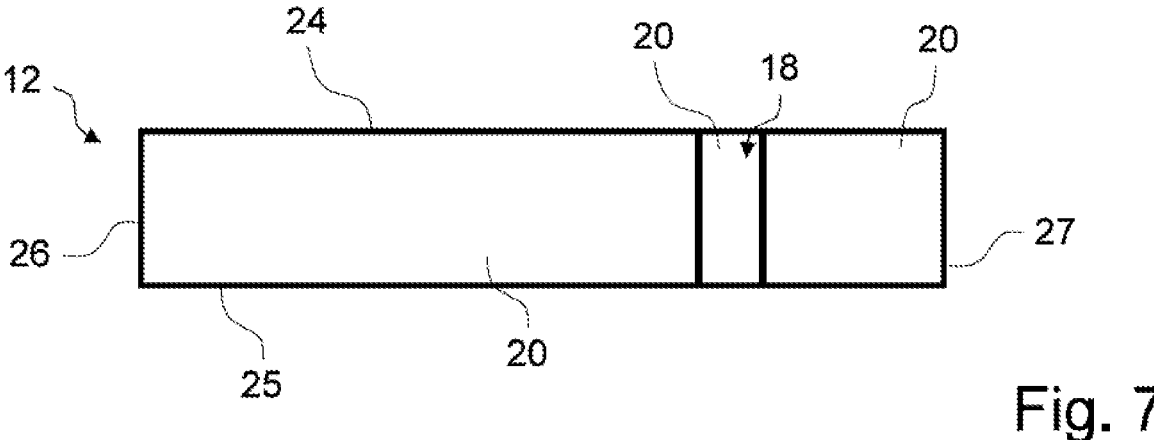
FIG. 7 schematically shows a side view of an edge-contact plug according to an example of the present invention.
Figure 8:
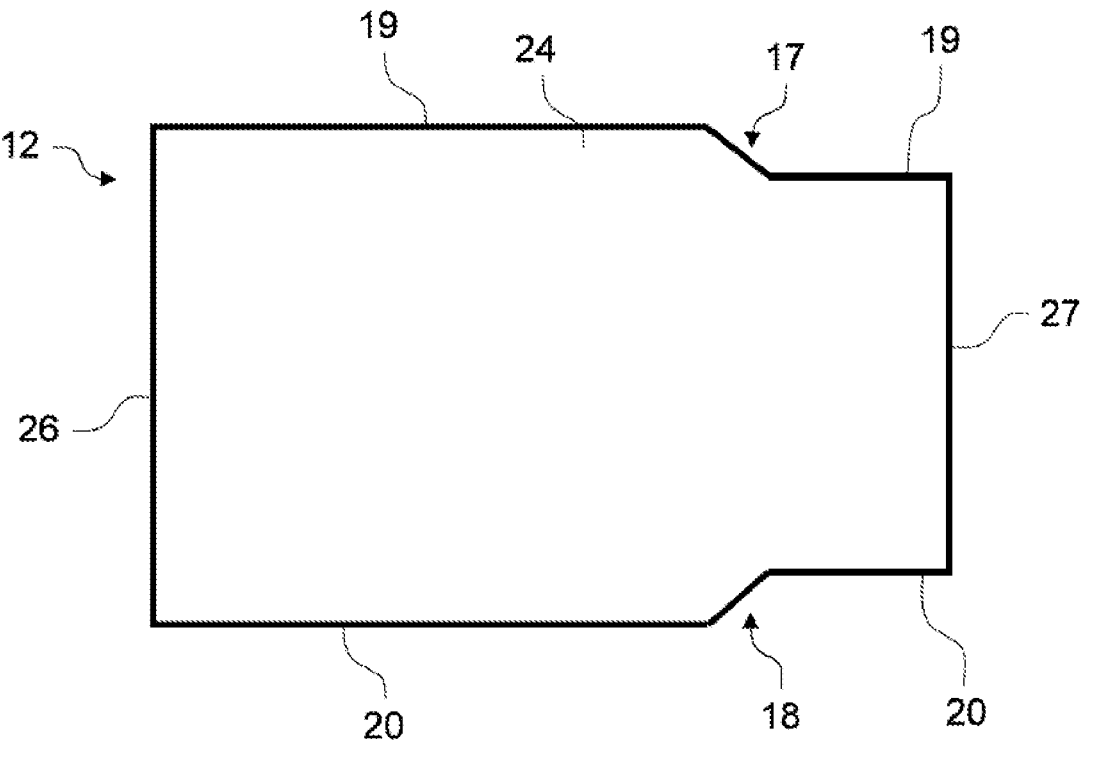
FIG. 8 schematically shows a top view of the edge-contact plug according to the above example of the present invention.

An edge-contact plug 12 is illustrated in FIG. 7 and FIG. 8 in a side view and in a top view. As illustrated in FIG. 7, edge-contact plug 12 has an upper side 24, a lower side 25, a contact side 26, a back side 27, and the two outer sides 19, 20, the set-back portions each extending continuously over the entire height of edge-contact plug 12 from upper side 24 to lower side 25, as shown in FIG. 8.

Figure 9:
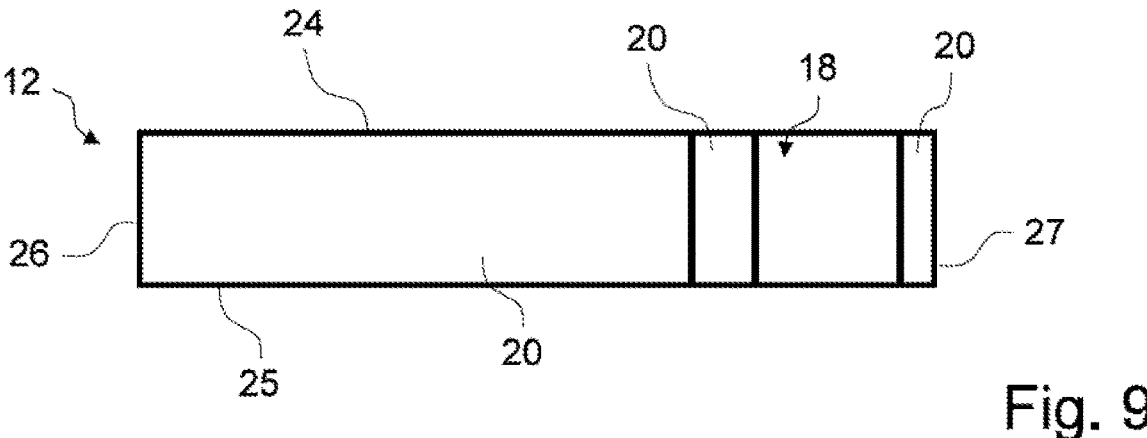
FIG. 9 schematically shows a side view of an edge-contact plug according to an example of the present invention.
Figure 10:
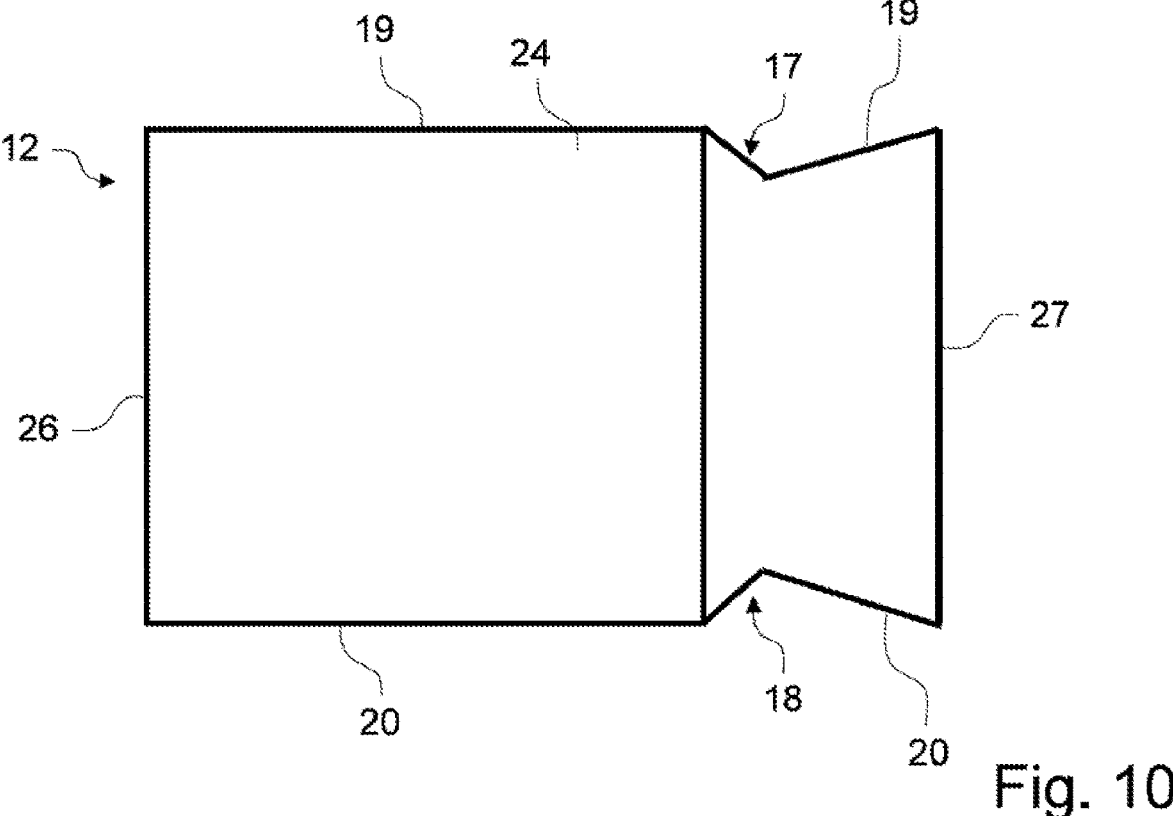
FIG. 10 schematically shows a top view of the edge-contact plug according to the above example of the present invention.

An edge-contact plug 12 is illustrated in FIG. 9 and FIG. 10 in a side view and in a top view. As illustrated in FIG. 9, edge-contact plug 12 has an upper side 24, a lower side 25, a contact side 26, a back side 27, and the two outer sides 19, 20, the set-back portions each extending continuously over the entire height of edge-contact plug 12 from upper side 24 to lower side 25, as shown in FIG. 10, and each being provided with a notch-shaped design. The width of edge-contact plug 12 between the two outer sides 19, 20 in a region between the set-back portion and back side 27 correspondingly changes up to back side 27 after the set-back portion. More specifically, the width in the direction of back side 27 is initially smaller and subsequently larger.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A latching system to establish a latching connection between a printed circuit board and an edge-contact plug, the latching system comprising:

an add-on part, including a fastening surface for fastening the add-on part to the printed circuit board, and the add-on part including two retaining arms, each having a latch; and two mating latches being formed on the edge contact plug to establish the latching connection with each latch of the two retaining arms, the two mating latches each being formed as a set-back portion on two different outer sides of the edge-contact plug, wherein the latches of the two retaining arms of the add-on part are adapted to engage with the set-back portions on the outer sides of the edge-contact plug to establish the latching connection, and wherein the add-on part further includes terminals that connect to the edge-contact plug when the latching connection is established between the printed circuit board and the edge-contact plug.

2. The latching system according to claim 1, wherein each latch of the two retaining arms have a wedge-shaped latching tab.

3. The latching system according to claim 1, wherein the set-back portions are each provided with a notch-shaped design.

4. The latching system according to claim 1, wherein the set-back portions are each provided with a stepped design.

5. The latching system according to claim 1, wherein the edge-contact plug has an upper side, a lower side, a contact side, a back side, and the two outer sides, and wherein the set-back portions each extend up to the upper side and/or to the lower side.

6. The latching system according to claim 5, wherein the set-back portions extend continuously over an entire height of the edge-contact plug from the upper side to the lower side.

7. The latching system according to claim 1, wherein the retaining arms extend beyond an edge contour of the printed circuit board in the manner of a projection.

8. The latching system according to claim 1, wherein the mating latches are designed as a one-piece and/or monolithic component of the edge-contact plug.

9. The latching system according to claim 1, wherein the edge-contact plug has an upper side, a lower side, a contact side, a back side, and the two outer sides, wherein a width of the edge-contact plug between the two outer sides being consistently smaller in a region between the set-back portion and the back side than in a region between the set-back portion and the contact side.

10. An add-on part for the latching system according to claim 1, the add-on part comprising:

the fastening surface for fastening the add-on part to the printed circuit board;

the two retaining arms, each having the latch to establish the latching connection in the set-back portions on the outer sides the edge-contact plug; and the terminals that connect to the edge-contact plug when the latching connection is established between the printed circuit board and the edge-contact plug.

\*    \*    \*    \*    \*